US009436549B2

(12) United States Patent
Tuers et al.

(10) Patent No.: US 9,436,549 B2
(45) Date of Patent: Sep. 6, 2016

(54) STORAGE MODULE AND METHOD FOR IMPROVED ERROR CORRECTION BY DETECTION OF GROWN BAD BIT LINES

(71) Applicant: SanDisk Technologies Inc., Plano, TX (US)

(72) Inventors: Daniel E. Tuers, Kapaa, HI (US); Abjiheet Manohar, Bangalore (IN)

(73) Assignee: SanDisk Technologies LLC, Plano, TX (US)

( * ) Notice: Subject to any disclaimer, the term of this patent is extended or adjusted under 35 U.S.C. 154(b) by 84 days.

(21) Appl. No.: 14/502,738

(22) Filed: Sep. 30, 2014

(65) Prior Publication Data

US 2016/0034353 A1  Feb. 4, 2016

(30) Foreign Application Priority Data

Jul. 31, 2014  (IN) ............................ 3759/CHE/2014

(51) Int. Cl.
*G06F 11/10* (2006.01)
*G06F 11/07* (2006.01)
*H03M 13/11* (2006.01)
*H03M 13/03* (2006.01)
*H03M 13/37* (2006.01)
*G11C 16/26* (2006.01)
*H03M 13/15* (2006.01)
*H03M 13/45* (2006.01)
*H03M 13/00* (2006.01)

(52) U.S. Cl.
CPC ...... *G06F 11/1076* (2013.01); *H03M 13/1102* (2013.01); *H03M 13/1111* (2013.01); *H03M 13/152* (2013.01); *H03M 13/3723* (2013.01); *H03M 13/451* (2013.01); *H03M 13/6325* (2013.01)

(58) Field of Classification Search
CPC .......... G06F 11/1044; G06F 11/1068; G06F 11/1072; G11C 11/5642; G11C 2211/5641; G11C 29/78; G11C 7/1006; G11C 16/26; H03M 13/09; H03M 13/1102; H03M 13/255; H03M 13/2906; H03M 13/1105; H04L 1/0057
USPC ......... 714/763, 764, 773, E11.034, E11.035, 714/E11.055; 365/185.03, 185.33; 711/E12.008, E12.001, 154
See application file for complete search history.

(56) References Cited

U.S. PATENT DOCUMENTS

| 7,623,388 | B2* | 11/2009 | Chen | G11C 11/408 365/185.22 |
|---|---|---|---|---|
| 7,826,274 | B2* | 11/2010 | Aritome | G06F 11/1068 365/185.17 |
| 7,904,783 | B2* | 3/2011 | Brandman | G06F 11/1068 714/755 |
| 8,000,135 | B1* | 8/2011 | Perlmutter | G11C 11/5642 365/185.03 |
| 8,630,118 | B2* | 1/2014 | Sakai | G11C 29/025 365/185.17 |
| 8,711,625 | B2 | 4/2014 | Li et al. | |
| 9,098,428 | B2* | 8/2015 | Tam | G06F 11/1012 |
| 9,104,591 | B2* | 8/2015 | Tam | G06F 11/1012 |
| 9,117,529 | B2* | 8/2015 | Karakulak | G11C 16/10 |
| 9,158,613 | B2* | 10/2015 | Jeon | G06F 11/0751 |

(Continued)

*Primary Examiner* — Phung M Chung
(74) *Attorney, Agent, or Firm* — Brinks Gilson & Lione (57) ABSTRACT

In one embodiment, a storage module comprises a controller and a memory having a plurality of bit lines. The controller detects an uncorrectable error in a code word read from the memory, determines location(s) of grown bad bit line(s) that contributed to the error in the code word being uncorrectable, and uses the determined location(s) of the grown bad bit line(s) to attempt to correct the error in the code word.

20 Claims, 9 Drawing Sheets (56) References Cited

U.S. PATENT DOCUMENTS

2013/0024747 A1* 1/2013 Sharon ............... G06F 11/1072
  714/773

2014/0157087 A1 6/2014 Yurzola et al.
2015/0381206 A1* 12/2015 Fainzilber .......... H03M 13/1108
  714/758

* cited by examiner

| Bitline # | Occurrences |
|---|---|
| 426 | 15 |
| 1343 | 15 |
| 1582 | 18 |
| 5186 | 14 |
| 5757 | 14 |
| 7682 | 18 |
| 7823 | 18 |

Figure 8

| Bitline # (16 bit) | Occurrences (8 bit) | Orientation Vector (8 bit signed) |
|---|---|---|
| 426 | 15 | -3 |
| 1343 | 15 | 2 |
| 1582 | 18 | 1 |
| 5186 | 14 | 14 |
| 5757 | 14 | 14 |
| 7682 | 18 | -2 |
| 7823 | 18 | -3 |

Figure 9

| Bitline # (16 bit) | Occurrences (8 bit) | Orientation Vector (8 bit signed) | Data from UECC Codeword | Conclusion |
|---|---|---|---|---|
| 426 | 15 | -3 | 0 | Could be 0 or 1 |
| 1343 | 15 | 2 | 0 | Could be 0 or 1 |
| 1582 | 18 | 1 | 1 | Could be 0 or 1 |
| 5186 | 14 | 14 | 1 | Likely open circuit |
| 5757 | 14 | 14 | 1 | Likely open circuit |
| 7682 | 18 | -2 | 0 | Could be 0 or 1 |
| 7823 | 18 | -3 | 1 | Could be 0 or 1 |

Figure 10

STORAGE MODULE AND METHOD FOR IMPROVED ERROR CORRECTION BY DETECTION OF GROWN BAD BIT LINES

PRIORITY

This application claims priority to India Patent Application No. 3759/CHE/2014, filed on Jul. 31, 2014, entitled "Storage Module and Method for Improved Error Correction by Detection of Grown Bad Bit Lines," the entire disclosure of which is hereby incorporated by reference.

BACKGROUND

Defects in a memory die can occur during manufacturing (e.g., due to contamination) and cause one or more bit lines in the memory to be defective. If the number of defective bit lines is too great, the memory die may need to be discarded. However, if the number of defective bit lines still allows the memory die to meet certain performance criteria, the defective bit lines can be dealt with by replacing the column (i.e., a grouping of multiple bit lines) that contains the defective bit line with a redundant column. Address decoding circuitry can then be configured to use the redundant column any time a request is received to use a bit line in the replaced column.

Bad bit lines caused by defects in the manufacturing process are typically identified during the testing phase of the memory die. However, shortages and open circuits can occur over time as the memory is used in the field, and these shortages and open circuits can cause additional bad bit lines to develop. Bit lines that become bad after manufacturing are sometimes referred to as "grown bad bit lines" and can cause an error in one or more cells of a code word read from the memory. An error correction code (ECC) decoder can be used to detect and correct such errors. However, if the number of errors is too great, the error will be uncorrectable. Accordingly, grown bad bit lines can lead to uncorrectable errors that degrade the reliability of the memory.

Overview

Embodiments of the present invention are defined by the claims, and nothing in this section should be taken as a limitation on those claims.

By way of introduction, the below embodiments relate to a storage module and method for improved error correction by detection of grown bad bit lines. In one embodiment, a storage module is provided comprising a controller and a memory having a plurality of bit lines. The controller detects an uncorrectable error in a code word read from the memory, determines location(s) of grown bad bit line(s) that contributed to the error in the code word being uncorrectable, and uses the determined location(s) of the grown bad bit line(s) to attempt to correct the error in the code word.

Other embodiments are possible, and each of the embodiments can be used alone or together in combination. Accordingly, various embodiments will now be described with reference to the attached drawings.

DETAILED DESCRIPTION OF THE PRESENTLY PREFERRED EMBODIMENTS

As mentioned in the background section above, grown bad bit lines (bit lines that become bad over time as the memory is used in the field) can result in errors that are uncorrectable by error correction code (ECC) mechanisms. Since current ECC mechanisms are not capable of learning about grown defects, the following embodiments can be used to teach the storage module about grown defects through additional reads, so the ECC mechanism can correct more errors and thereby reduce the number of uncorrectable errors encountered. These embodiments also provide more accuracy than column replacement tables, as these embodiments deal with individual bit lines rather than groupings of bits lines, some of which way not be bad. Before turning to these and other embodiments, the following paragraphs provide a discussion of exemplary storage modules that can be used with these embodiments. Of course, these are just examples, and other suitable types of storage modules can be used.

Figure 1:
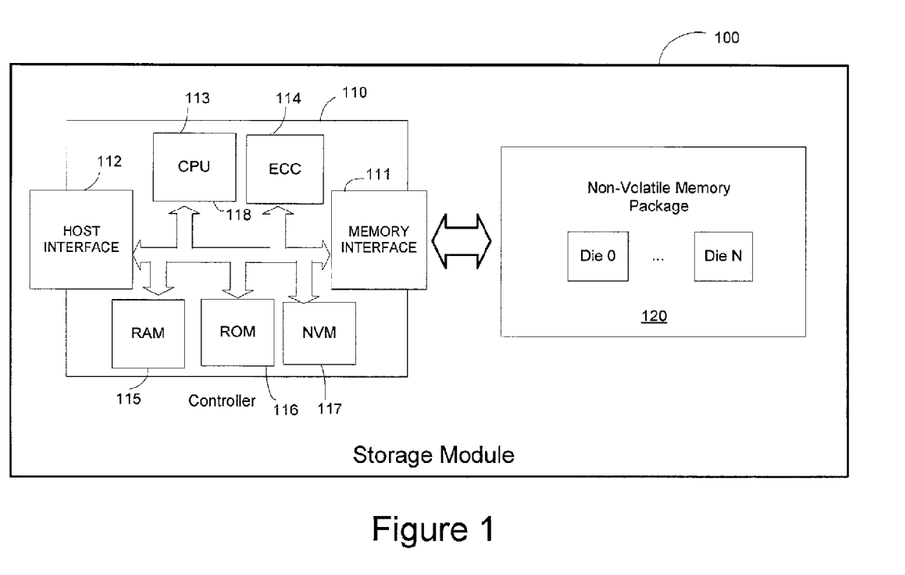
FIG. 1 is a block diagram of an exemplary storage module of an embodiment.

As illustrated in FIG. 1, a storage module 100 of one embodiment comprises a storage controller 110 and a non-volatile memory package 120 containing a plurality of memory dies (Die 0 to Die N). Although only one non-volatile memory package is shown in FIG. 1, it should be understood that the storage module 100 can have more than one non-volatile memory package. The storage controller 110 comprises a memory interface 111 for interfacing with the non-volatile memory package 120 and a host interface 112 for placing the storage module 100 operatively in communication with a host controller. As used herein, the phrase "operatively in communication with" could mean directly in communication with or indirectly in (wired or wireless) communication with through one or more components, which may or may not be shown or described herein.

Figure 2A:
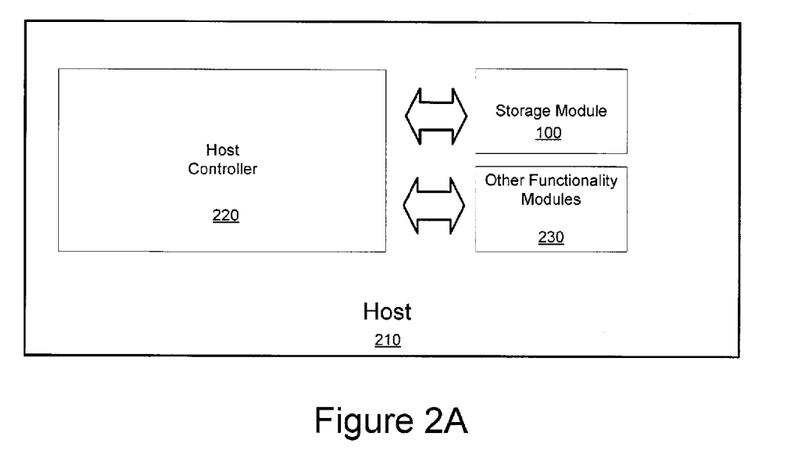
FIG. 2A is a block diagram of a host of an embodiment, where the exemplary storage module of FIG. 1 is embedded in the host.

As shown in FIG. 2A, the storage module 100 can be embedded in a host 210 having a host controller 220. That is, the host 210 embodies the host controller 220 and the storage module 100, such that the host controller 220 interfaces with the embedded storage module 100 to manage its operations. For example, the storage module 100 can take the form of an iNAND™ eSD/eMMC embedded flash drive by SanDisk Corporation, or, more generally, any type of solid state drive (SSD), a hybrid storage device (having both a hard disk drive and a solid state drive), and a memory caching system. The host controller 220 can interface with the embedded storage module 100 using, for example, an eMMC host interface or a UFS interface. The host 210 can take any form, such as, but not limited to, a mobile phone, a tablet computer, a digital media player, a game device, a personal digital assistant (PDA), a mobile (e.g., notebook, laptop) personal computer (PC), or a book reader. As shown in FIG. 2A, the host 210 can include optional other functionality modules 230. For example, if the host 210 is a mobile phone, the other functionality modules 230 can include hardware and/or software components to make and place telephone calls. As another example, if the host 210 has network connectivity capabilities, the other functionality modules 230 can include a network interface. Of course, these are just some examples, and other implementations can be used. Also, the host 210 can include other components (e.g., an audio output, input-output ports, etc.) that are not shown in FIG. 2A to simplify the drawing. It should be noted that while the host controller 220 can control the storage module 100, the storage module 100 can have its own controller to control its internal memory operations. Also, in general, a host controller can be any controller capable of interfacing with the storage module, be it a controller in monolithic form, an entire controller, or a separate functionality module.

Figure 2B:
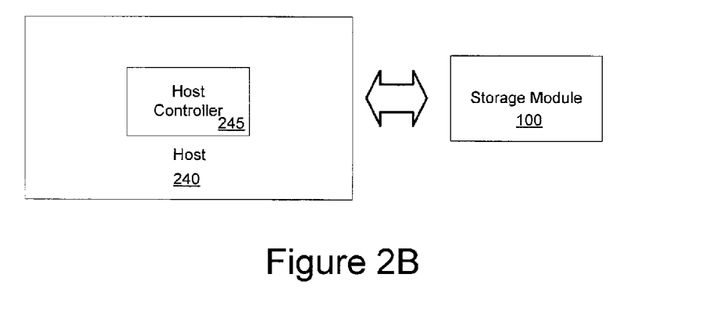
FIG. 2B is a block diagram of the exemplary storage module of FIG. 1 removably connected to a host, where the storage module and host are separable, removable devices.

As shown in FIG. 2B, instead of being an embedded device in a host, the storage module 100 can have physical and electrical connectors that allow the storage module 100 to be removably connected to a host 240 (having a host controller 245) via mating connectors. As such, the storage module 100 is a separate device from (and is not embedded in) the host 240. In this example, the storage module 100 can be a handheld, removable memory device, such as a Secure Digital (SD) memory card, a microSD memory card, a Compact Flash (CF) memory card, a universal serial bus (USB) device (with a USB interface to the host), or a solid-state drive (SSD), and the host 240 is a separate device, such as a mobile phone, a tablet computer, a digital media player, a game device, a personal digital assistant (PDA), a mobile (e.g., notebook, laptop) personal computer (PC), or a book reader, for example.

In FIGS. 2A and 2B, the storage module 100 is in communication with a host controller 220 or host 240 via the host interface 112 shown in FIG. 1. The host interface 112 can take any suitable form, such as, but not limited to, an eMMC host interface, a UFS interface, and a USB interface. The host interface 110 in the storage module 110 conveys memory management commands from the host controller 220 (FIG. 2A) or host 240 (FIG. 2B) to the storage controller 110, and also conveys memory responses from the storage controller 110 to the host controller 220 (FIG. 2A) or host 240 (FIG. 2B). Also, it should be noted that when the storage module 110 is embedded in the host 210, some or all of the functions described herein as being performed by the storage controller 110 in the storage module 100 can instead be performed by the host controller 220.

Returning to FIG. 1, the storage controller 110 comprises a central processing unit (CPU) 113, an error correction code (ECC) module 114 operative to encode and/or decode an ECC code word with data and syndrome bits, read access memory (RAM) 215, read only memory (ROM) 116 which can store firmware for the basic operations of the storage module 100, and a non-volatile memory (NVM) 117 which can store a device-specific key used for encryption/decryption operations, when used. The storage controller 110 can be implemented in any suitable manner. For example, the storage controller 110 can take the form of a microprocessor or processor and a computer-readable medium that stores computer-readable program code (e.g., software or firmware) executable by the (micro)processor, logic gates, switches, an application specific integrated circuit (ASIC), a programmable logic controller, and an embedded microcontroller, for example. Suitable controllers can be obtained from SanDisk or other vendors. The storage controller 110 can be configured with hardware and/or software to perform the various functions described below and shown in the flow charts. Also, some of the components shown as being internal to the storage controller 110 can also be stored external to the storage controller 110, and other component can be used. For example, the RAM 115 (or an additional RAM unit) can be located outside of the controller die and used as a page buffer for data read from and/or to be written to the memory package 120.

The memory dies in the non-volatile memory package 120 can also take any suitable form. For example, in one embodiment, one or more of the memory dies take the form of a solid-state (e.g., flash) memory and can be one-time programmable, few-time programmable, or many-time programmable. The memory dies can also use single-level cell (SLC), multiple-level cell (MLC), triple-level cell (TLC), or other memory technologies, now known or later developed. Also, the memory dies can be a two-dimensional memory or a three-dimensional memory.

Figure 3:
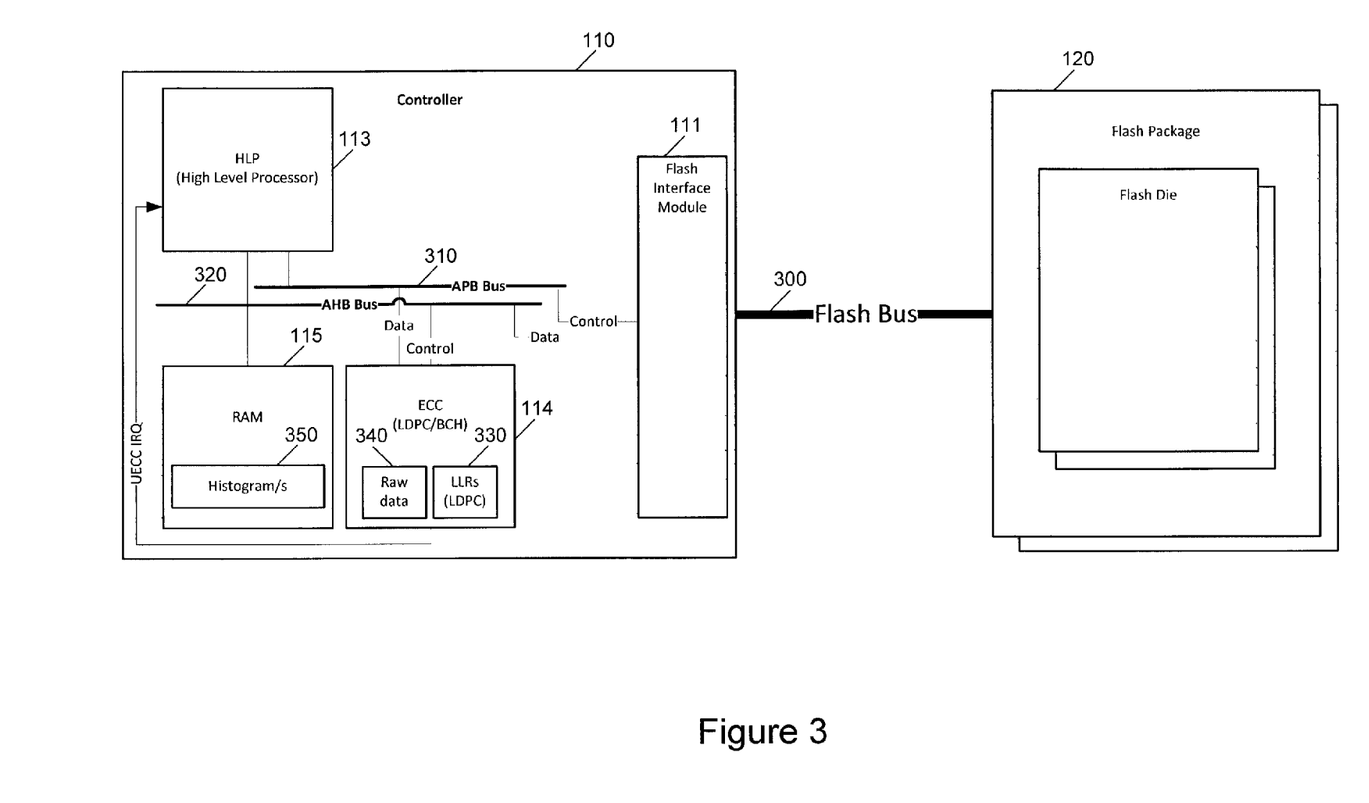
FIG. 3 is a block diagram of a controller and flash package of an embodiment.

Turning again to the drawings, FIG. 3 is a diagram of some of the components of the controller 110 and memory package 120 of one embodiment. This is merely an example, and other components can be used. As shown in FIG. 3, in this embodiment, the non-volatile memory package 120 takes the form of a Flash package with a plurality of Flash dies, and the memory interface 111 takes the form of a Flash Interface Module (FIM). A Flash bus 300 connects the FIM 111 of the controller 110 with the Flash package 120. The CPU 113 in the controller 110 takes the form of a high-level processor. An Advanced Peripheral Bus (APB) 310 and an Advanced High-performance Bus (AHB) 320 communicate data and control signals internally in the controller 110.

The ECC engine 114 can be implemented in any suitable way using any suitable error correction code technique. In this particular embodiment, the ECC engine 114 implements a low-density parity-check (LDPC). LDPC is an example of "soft-input ECC" in which probability information is provided to an ECC decoder with respect to data bits being decoded, and the ECC decoder uses the probability information to find the most-likely solution. Such soft-input decoding may be used in charge storage memory, for example, by using a high-resolution read to resolve not only the memory state of a particular memory cell but also the reliability of the read data. Reliability may be measured by different metrics, where one the commonly-used metrics is the Log Likelihood Ratio (LLR). (FIG. 3 shows LLR information 330, along with raw data 340, being used by the ECC engine 114.) In another embodiment, the ECC engine 114 implements a BCH code. Further explanation of ECC is provided in the following documents, which are hereby incorporated by reference: U.S. Pat. Nos. 8,711,625; 7,904,783; and U.S. patent application Ser. No. 13/793,282.

In general, when a code word (i.e., data and ECC parity (or syndrome) bits) are read from the memory 120, the ECC engine 114 decodes the code word to determine if the ECC parity bits decode to the data in the code word. If they don't, an error has occurred. The ECC engine 114 can detect and correct errors below a certain number, with the maximum number of correctable errors being dependent on the particular ECC scheme that is used. However, if the ECC engine 114 cannot correct an error, the ECC engine 114 sends an uncorrectable error code correction (UECC) event interrupt request (IRQ) to the processor 113.

One reason for errors is bad bit lines. As mentioned in the background section above, bad bit lines can be detected during the manufacturing of a memory die, and information about the location of the bad bit lines can be stored in the memory for use by the ECC engine to help correct errors. However, shortages and open circuits can occur over time as the memory is used in the field, and these shortages and open circuits can cause additional bad bit lines to develop ("grown bad bit lines"), which can contribute to an uncorrectable error.

Figure 4:
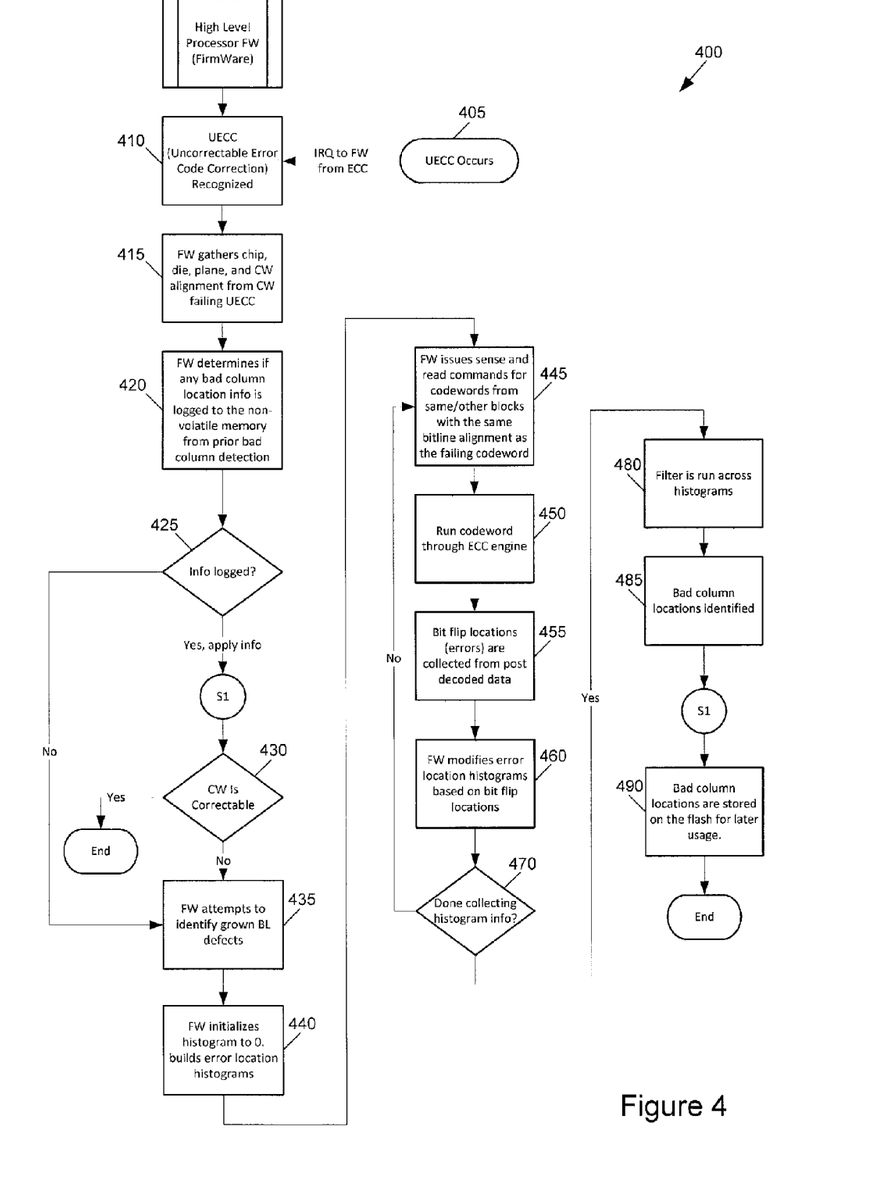
FIGS. 4 and 5 are flow charts of a method of an embodiment for improved error correction by detection of grown bad bit lines.

The following embodiments can be used to detect grown bad bit lines and possibly correct an otherwise uncorrectable error. In general, when the storage controller 110 in the storage module 100 detects an uncorrectable error in a code word (i.e., data and ECC bits) read from the memory 120, it determines location(s) of grown bad bit line(s) that contributed to the error in the code word being uncorrectable. In one embodiment, location(s) of grown bad bit line(s) are detected using histogram(s). The controller 110 then uses the determined location(s) of the grown bad bit line(s) to attempt to correct the error in the code word. This embodiment will now be described in conjunction with the flow chart 400 in FIG. 4. It should be noted that FIG. 4 is just one example, and the components and techniques mentioned in FIG. 4 should not be read into the claims unless expressly recited therein. For example, while the below example states that the firmware in the processor 113 performs various functions, hardware in the processor 113 or hardware, firmware, or software in another component in the processor 113 or the storage module 100 can perform some or all of these functions (or additional/fewer functions).

Figure 5:
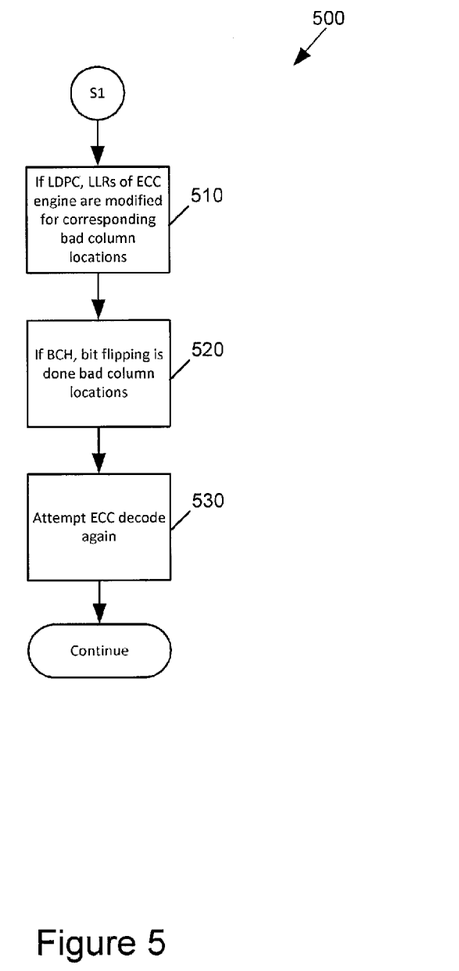

As shown in the flow chart 400 in FIG. 4, when an uncorrectable error code correction (UECC) event occurs (act 405), firmware in the high-level processor 113 recognizes the UECC (act 410). When an UECC event happens, it may still be possible to correct an "uncorrectable" error using information about bad bit lines that were detected in the testing of the memory. To do this, the firmware first identifies where the code word is and what bit lines are associated with it by, for example, gathering chip, die, plane, and the code word's alignment (act 415). Next, the firmware determines if any bad column location information is logged to the non-volatile memory from a prior bad column detection (e.g., from testing at manufacturing) (act 420). If such information is logged and it relates to the bit lines in question, the flow chart 500 in FIG. 5 is performed to attempt to correct the error. As shown in FIG. 5, if the ECC engine 114 uses LDPC, the LLRs of the ECC engine can be modified for the corresponding bad column locations (act 510). On the other hand, if the ECC engine 114 uses BCH, bit flipping can be done at the bad column locations (act 520). In either event, the ECC engine 114 attempts to ECC decode the code word again (act 530).

If the code word is correctable after performing the acts in the flow chart 500 in FIG. 5, the process ends. However, if the code word is still not correctable or if no bad column location information was logged, it may still be possible to correct the uncorrectable error if it was caused by grown bad bit lines (i.e., bit lines that went bad after the initial testing of the memory when the bad column location information was logged). In this embodiment, the firmware in the processor 113 identifies grown bit line defects that may have contributed to the error being uncorrectable and then generates a histogram of error frequency of each of the bit lines from a plurality of additional code words read from those bit lines. The bit line(s) that the histogram shows as containing more than a threshold number of errors are identified as the grown bad bit line(s). Of course, this is just one example, and other ways of determining the location(s) of grown bad bit line(s) can be used.

Returning to FIG. 4, the firmware in the processor 113 first needs to identify grown bit line defects that may have contributed to the error in the code word (act 435). In this example, the firmware allocates space for the histogram 350 (e.g., in RAM 115 (see FIG. 3)), initializes the histogram to 0, and builds error locations in the histogram (act 440). In this example, eight-bit bins are defined for every one bit in the code word, and a code word has the size of 1 KB (in other embodiments the code word has a size of 2 or 4 K), with the physical page of memory being 8-16 K). So, the total space allocation for two histogram arrays (one array for the flipping direction and one array for the number of occurrences) in this example is 16 KB. It should be noted that, in this example, a compressed table is not used. Instead, this example assumes that the sample size will lead to at least one or more bit failures on a significant number of bit lines and uses arrays and directing indexing for the histogram. This is also a faster method of data collection since a table search for an address and table management functions are not used.

Next, the firmware issues sense and read commands for the code words from the same/other blocks with the same bit line alignment as the failing code word (act 445). In this embodiment, the location(s) of the grown bad bit line(s) are detecting by reading a plurality of additional code words that share the same bit lines as the code word that has the uncorrectable error (e.g., neighboring word lines with the same alignment to the Flash memory unit (FMU) being decoded). These word lines can be sampled from either the same block or neighboring blocks (i.e., any block within the same plane), as long as they all share common bit lines. The sample can be taken from a fresh block to avoid data retention noise and additional decode latency. In one particular example, the sample size is one code word from 32 word lines from the same block. Preferably (but not a requirement), the sample size is the filter margin+ BitErrorRate*codewordSize, with the block being sampled having a projected bit error rate (BER) of $7e^{-3}$.

The read code words are then run through the ECC engine 114 (act 450), and bit flip locations (errors) are collected from the post-decoded data (act 455) (this example assumes that good data from the adjacent word lines can be found and corrected with the ECC engine 114). To collect the bit error locations, the ECC engine 114 can be used in a manner that either outputs the flipped bit locations (e.g., the output of a Chien search in a BCH implementation or a dump of the QRAM bit flip information in an eLDPC implementation) or a simple comparison of the data prior to encoding and post decoding (further processing may be needed if the data is scrambled).

After every decode operation completes, the error location and the original orientation is determined (the resulting orientation of the correction can be inferred by the original orientation, hence a signed magnitude can be used to represent it). If the firmware is incapable of producing the locations and orientation, then the firmware can XOR the data prior to correction with the data after correction. Every 1 after the XOR represents an error. Note, if the firmware has to manually extract the error locations, it may also have to manually descramble the pre-encoded data using a corrected scrambler seed.

Figure 6:
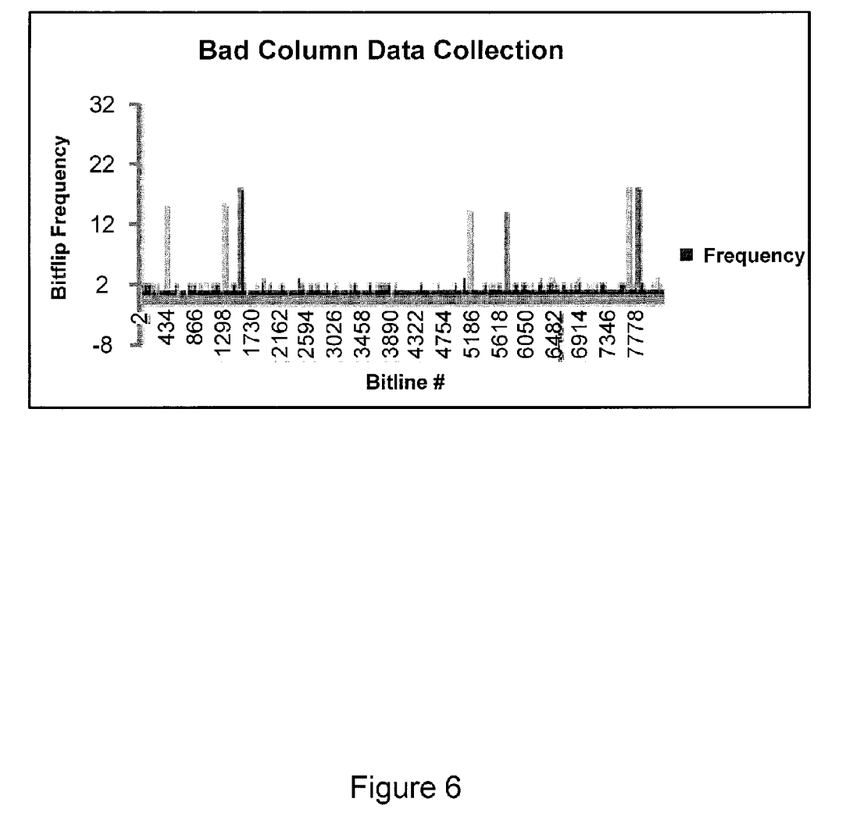
FIGS. 6 and 7 are illustrations of histograms of an embodiment.

The firmware then modifies the error location histograms based on the bit flip locations (act 460) (i.e., the information on which bits are flipped is collected and used to create a histogram of bit flip locations). FIG. 6 is an example of a histogram 330. In this example, the histogram includes an information field (the bit line location of bit flips (16 bits)) and three histograms: Histogram 1 (frequency that the bit was flipped (16 bits)), Histogram 2 (whether the original bit stored was a 1) (16 bits)), and Histogram 3 (whether the original bit stored was a 0 (16 bits)). In this example, the second and third histograms are combined into one because the second histogram stores 8-bit signed values. The polarity of the bin value indicates if the original orientation of the bit before being flipped by the correction was a 1 or a 0. The magnitude of the bin indicates the frequency of occurrence. So, if the original orientation was 0, and it was flipped after decode to 1, the bin is decremented, and changes from 0 to −1. The process repeats for every word line sampled and bit error encountered. Knowing the original orientation of the bit and whether it was flipped can help determine if the line is shorted, open, or contains general noise. The algorithm can sample other word lines to determine if the there is an open in the circuit.

When the firmware determines it is done collecting a sufficient amount of histogram information (act 470), a high-pass filter is run across the histograms to remove any "noise" (i.e., general bit errors) (act 480), and the bad columns are identified based on which bit lines contain more than a threshold amount of errors (act 485). This example assumes the data pattern is of normal distribution and is not biased and that there is enough delta to distinguish between a good bit line and a bad bit line. In this example, the filter is very simple because the noise is easy to distinguish and the bad bit line locations can be extracted through simply forward parsing of the histogram. As the sample size decreases or the noise (the bit error rate (BER)) increases, the filter mechanism may need to become more complicated. Also, the bad bit line information can be combined with existing bad column information for further verification of the error locations. Using the exact bit line locations can help correct more errors on code words that are uncorrectable by using the characteristics of other correctable pages (or data) in the same plane.

Figure 7:
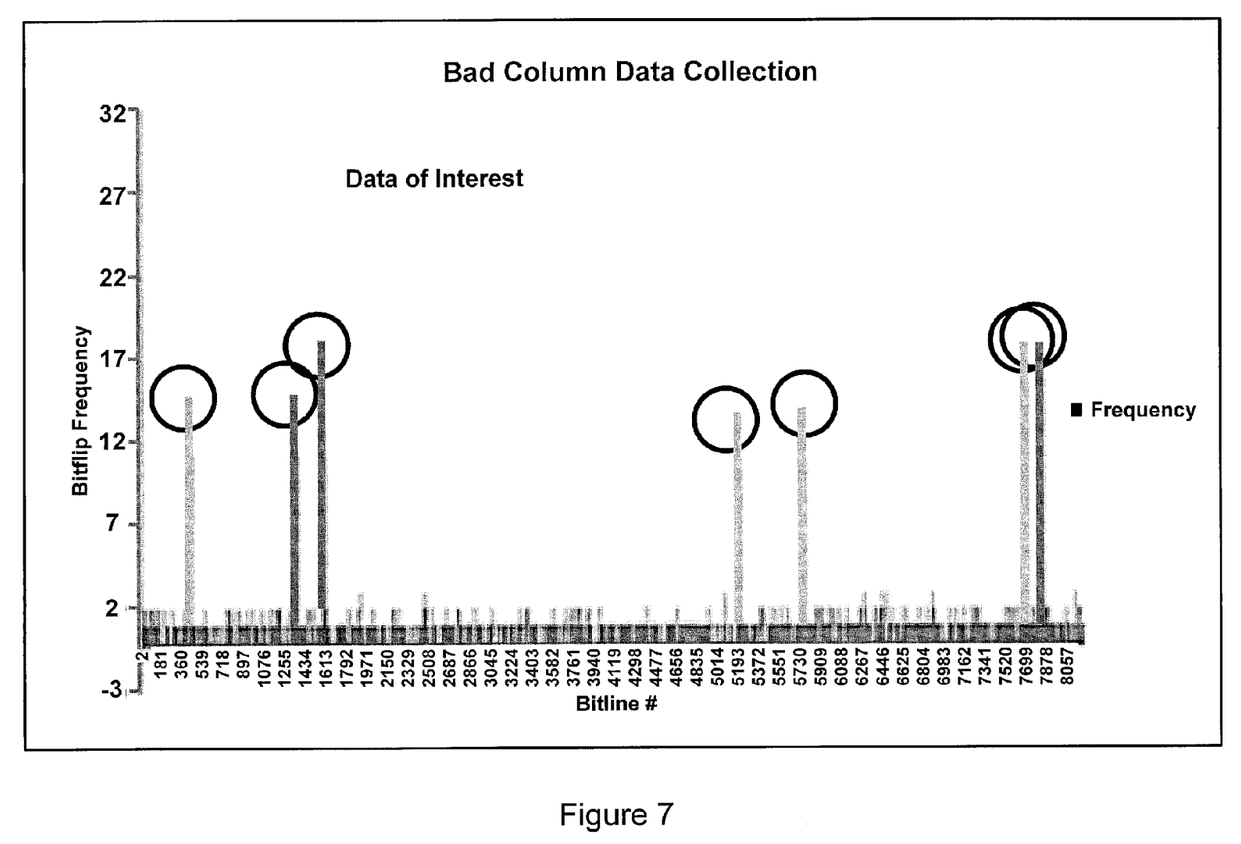
Figure 8:
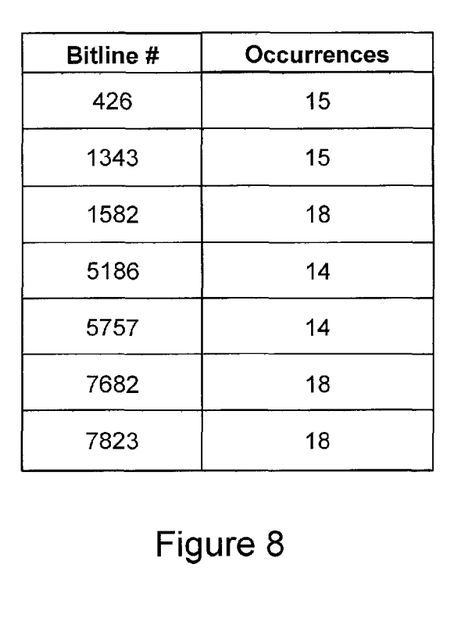
FIG. 8 is a chart of an embodiment showing bit line numbers and number of error occurrences.
Figure 9:
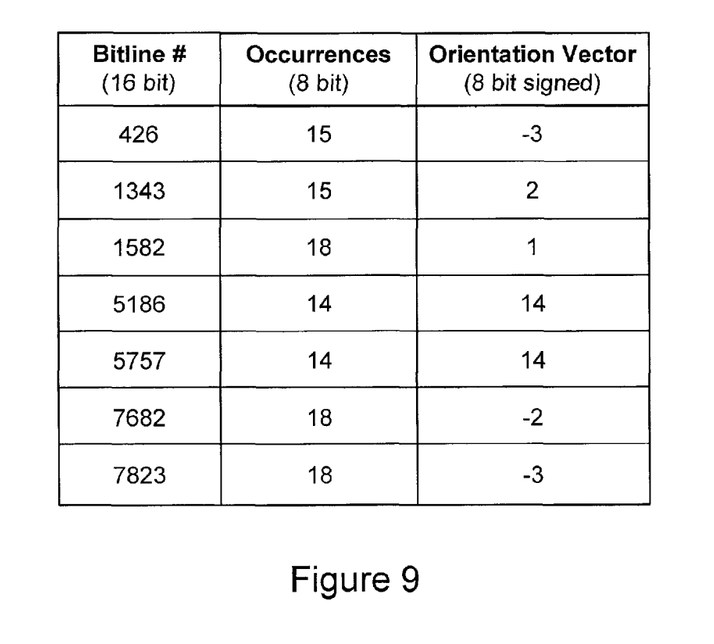
FIG. 9 is a chart of an embodiment showing bit line numbers, number of error occurrences, and orientation vector.

FIG. 7 is an illustration of the histogram with circles around the bit lines that pass the high-pass filter, and FIG. 8 is a chart showing bit line numbers and number of error occurrences that are extracted from the histogram after the filter operation. The processor 113 can then correlate the second histogram, which is the orientation histogram. All the other data in the orientation histogram is just noise and is ignored. FIG. 9 is a chart showing bit line numbers, number of error occurrences, and orientation vector after this processing. The processor 113 can then put the orientation data through another algorithm, in which a large positive vector value indicates that the bit line is likely an open circuit, a large negative vector value indicates that the bit line is likely a closed circuit, and a vector close to 0 indicates that the data has a large frequency of incorrectly storing data, but it is not an open or a closed circuit.

Figure 10:
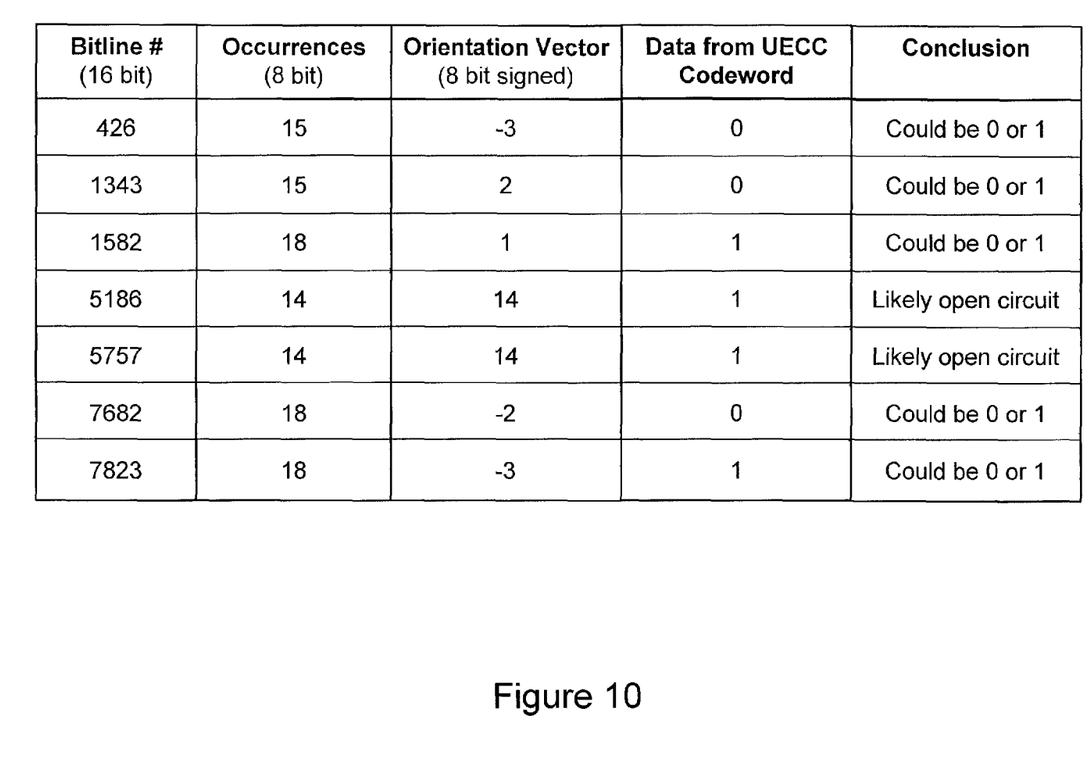
FIG. 10 is a chart of an embodiment showing bit line number, numbers of error occurrences, orientation vector, code word data, and conclusion.

With the information, the acts in FIG. 5 are performed to attempt to decode the UECC code word again using the knowledge gained from the histograms (acts 510-530). As shown in the chart in FIG. 10, the processor 113 can apply the knowledge gained from the histograms to the UECC data by correlating the new bit line information with data failing UECC). For example, the suspicious bad bit line information can be used to assist the decoding process by feeding the data to either the LDPC engine as a scalar of soft bit information (i.e., all LLRs for the bit line locations can be modified to a neutral state (either could be 1 or 0) to modify the LLRs prior to decoding). As another example, the information can be used with the BCH engine as a smart bit flip algorithm prior to the engine decoding (i.e., in a BCH implementation, the bits can be flipped generically in order to help the decoder). In an eLDPC implementation, the detected bad bit lines can be fed into the eLDPC as an alternative bad column table. Then, the bad column locations are stored for later usage in attempting to correct errors in additional code words read from the grown bad bit line(s) (act 490). For example, the additional bad bit line information can be saved in RAM 115 and/or Flash 120 for future corrections. After further analysis, the additional bad bit line information can also be fed back into the bad column replacement table within the LDPC engine (e.g., the "logged info" in act 425). It should be noted that this entire procedure was only done for a portion of a single plane in this example. These acts can be repeated for all planes via decode failures. Also, if uncorrectable errors occur in the future, it could be because more defects were grown, and the above process could be run again.

In addition to or instead of using the grown bad bit locations to correct an otherwise uncorrectable error, the information about the grown bad bit locations can be fed forward to a smart scrambler logic, so that data can be scrambled in such a way that it maps over the failed bit lines and still provides randomness for the other good bit lines.

Finally, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

What is claimed is:

1. A storage module comprising:
   a memory having a plurality of bit lines; and
   a controller in communication with the memory, wherein the storage controller is configured to:
   detect an uncorrectable error in a code word read from the memory;
   determine at least one location of at least one grown bad bit line that contributed to the error in the code word being uncorrectable; and
   use the determined at least one location of the at least one grown bad bit line to attempt to correct the error in the code word.

2. The storage module of claim 1, wherein the controller is configured to determine the at least one location of the at least one grown bad bit line by:
   reading a plurality of additional code words that share the same bit lines as the code word that has the uncorrectable error; and
   generating a histogram of error frequency of each of the bit lines.

3. The storage module of claim 2, wherein the controller is further configured to:
apply a high-pass filter to the histogram to identify the at least one location of the at least one grown bad bit line.

4. The storage module of claim 2, wherein the histogram also indicates an originally-stored value of a bit that was in error.

5. The storage module of claim 1, wherein the controller implements an ECC engine using low-density parity-check (LDPC) code, and wherein the controller is configured modify a log likelihood ratio (LLR) of the ECC engine for the determined at least one location of the at least one grown bad bit line before attempting to correct the error.

6. The storage module of claim 1, wherein the controller implements an ECC engine using BCH code, and wherein the controller is configured to flip at least one bit in the respective determined at least one location of the at least one grown bad bit line before attempting to correct the error.

7. The storage module of claim 1, wherein the controller is configured to store the at least one location of the at least one grown bad bit line for later use in attempting to correct errors in additional code words later read from the at least one grown bad bit line.

8. The storage module of claim 1, wherein the memory is a three-dimensional memory.

9. The storage module of claim 1, wherein the storage module is embedded in a host.

10. The storage module of claim 1, wherein the storage module is removably connected to a host.

11. A method for improved error correction by detection of at least one grown bad bit line, the method comprising:
performing the following in a storage module comprising a memory having a plurality of bit lines:
detecting an uncorrectable error in a code word read from the memory;
determining at least one location of at least one grown bad bit line that contributed to the error in the code word being uncorrectable; and
using the determined at least one location of the at least one grown bad bit line to attempt to correct the error in the code word.

12. The method of claim 11, wherein the at least one location of the at least one grown bad bit line are determined by:
reading a plurality of additional code words that share the same bit lines as the code word that has the uncorrectable error; and
generating a histogram of error frequency of each of the bit lines.

13. The method of claim 12 further comprising:
applying a high-pass filter to the histogram to identify the at least one location of the at least one grown bad bit line.

14. The method of claim 12, wherein the histogram also indicates an originally-stored value of a bit that was in error.

15. The method of claim 11, wherein the storage module implements an ECC engine using low-density parity-check (LDPC) code, and wherein the method further comprises modifying a log likelihood ratio (LLR) of the ECC engine for the determined at least one location of the at least one grown bad bit line before attempting to correct the uncorrectable error.

16. The method of claim 11, wherein the storage module implements an ECC engine using BCH code, and wherein the method further comprises flipping at least one bit in the determined at least one location of the at least one grown bad bit line before attempting to correct the uncorrectable error.

17. The method of claim 11, wherein the method further comprises storing the at least one location of the at least one grown bad bit line for later use in attempting to correct errors in additional code words later read from the at least one grown bad bit line.

18. The method of claim 11, wherein the memory is a three-dimensional memory.

19. The method of claim 11, wherein the storage module is embedded in a host.

20. The method of claim 11, wherein the storage module is removably connected to a host.

* * * * *